(12) United States Patent
Spirkl et al.

(10) Patent No.: US 7,957,254 B2
(45) Date of Patent: Jun. 7, 2011

(54) CONCEPT FOR REDUCING CROSSTALK

(75) Inventors: Wolfgang Spirkl, Germering (DE); Holger Steffens, Munich (DE)

(73) Assignee: Qimonda AG, Munich (DE)

( * ) Notice: Subject to any disclaimer, the term of this patent is extended or adjusted under 35 U.S.C. 154(b) by 516 days.

(21) Appl. No.: 12/050,522

(22) Filed: Mar. 18, 2008

(65) Prior Publication Data

US 2008/0232233 A1 Sep. 25, 2008

(30) Foreign Application Priority Data

Mar. 20, 2007 (DE) .................. 10 2007 013 314

(51) Int. Cl.
*H04J 1/12* (2006.01)
*H04J 3/10* (2006.01)
(52) U.S. Cl. .................. 370/201; 370/202; 370/252
(58) Field of Classification Search .................. 370/201
See application file for complete search history.

(56) References Cited

U.S. PATENT DOCUMENTS

| 5,887,032 A | 3/1999 | Cioffi | |
|---|---|---|---|
| 6,888,444 B1* | 5/2005 | Yamauchi | 340/286.01 |
| 2003/0235145 A1* | 12/2003 | Shanbhag et al. | 370/201 |
| 2006/0159002 A1* | 7/2006 | Kim et al. | 370/201 |
| 2007/0002722 A1* | 1/2007 | Palaskas et al. | 370/201 |
| 2007/0217245 A1* | 9/2007 | Wang et al. | 365/63 |

* cited by examiner

*Primary Examiner* — Huy D Vu
*Assistant Examiner* — Omer Mian
(74) *Attorney, Agent, or Firm* — John S. Economou

(57) ABSTRACT

A device for reducing mutual crosstalk of a signal routed across a first line and a second signal routed across a second line, wherein by the mutual crosstalk at an output of the first line a first interfered signal may be obtained and at an output of the second line a second interfered signal may be obtained, comprising a modifier for modifying the first interfered signal that is interfered by crosstalk due to the second signal, and for modifying the second interfered signal that is interfered by crosstalk due to the first signal, wherein the modifier is adapted to model an interference due to the mutual crosstalk, and a combiner for combining the first interfered signal with the modified second interfered signal to obtain a first corrected signal and for combining the second interfered signal with the modified first interfered signal to obtain a second corrected signal.

23 Claims, 12 Drawing Sheets

CONCEPT FOR REDUCING CROSSTALK

This application claims priority from German Patent Application No. 10 2007 013 314.8, which was filed on Mar. 20, 2007, and is incorporated herein in its entirety by reference.

TECHNICAL FIELD

Embodiments of the present invention relate to a concept for reducing mutual crosstalk of a first routed signal and a second routed signal, as it may, for example, be used for the compensation of crosstalk between bitlines in DRAM circuits (DRAM=dynamic random access memory).

BACKGROUND

Crosstalk regularly results, for example, in communication systems, wherein a first signal of a first communication channel is disturbed by interference from a second signal of a second communication channel. Interference may result from a plurality of effects. In electric systems, like, for example, systems on circuit boards, electric plug connections or two-wire cable bundles, every electric path acts as a communication channel. With high data rates, capacitive, inductive and resistive crosstalk results between adjacent electric paths or lines, respectively, wherein, due to the practical relevance, in the following purely capacitive crosstalk is considered. Emitted energy from a first line is unwantedly coupled to a second line or received by the second line, respectively. This unwanted transfer of signal energy, generally referred to as crosstalk, may substantially deteriorate the data reception on the second line. Crosstalk is typically bi-directional, so that one line may both emit energy to one or several lines and also receive electromagnetic energy from one or several lines.

Due to the increasing integration density of integrated circuits, electric systems set up from the same are becoming continuously smaller. From this, an ever decreasing distance between adjacent electric lines results. By decreasing distances between adjacent lines, their capacitive coupling, and thus the crosstalk between the adjacent lines, continually increases. Without suitable countermeasures, crosstalk will more and more become a limiting factor with regard to increasing data rates of modern electric systems.

For example, memory systems like SRAM (SRAM=static random access memory) or DRAM memory systems may be regarded as examples for an electric system with ever denser adjacent lines. With DRAM memories, a charge of a memory cell capacitor is interpreted as a logic memory state, usually "1" or "0". During a read access, the charge of different cell capacitors selected using a word line are switched to the respective bitlines. The voltage applied to the bitlines is amplified by so-called read amplifiers and compared to a reference voltage, the bitline medium voltage.

Here, the voltage of a certain bitline depends on the charge of the respective cell capacitor. Additionally, by capacitive coupling, signals of adjacent bitlines couple over to the bitline. This crosstalk may be substantial and thus strongly decrease a signal-to-noise power ratio on bitlines. This may necessitate a longer read and/or write period and/or a longer bitline precharge time. Thus, the power of memory systems may significantly decrease with regard to speed.

The crosstalk between bitlines is even more critical for DRAM memories which use more than two logical values (so-called multilevel logic). In this case, the signal-to-noise power ratio on the bitlines limits the number of logical states which may be mapped to the charge of a single capacitor.

It would thus be desirable to reduce negative effects, like, for example, the decrease of the signal-to-noise power ratio caused by the crosstalk between adjacent lines.

This may, for example, be done by lengthening the time period between activating and sampling, i.e., reading or writing memory contents, respectively. By this, however, a capacity of the memory system is reduced with regard to speed.

Further, the distance between adjacent bitlines might be increased. This would, however, lead to a lower integration density and thus increase manufacturing costs due to the increased space requirements.

Further, it is normal to use twisted bitlines (so-called twisted arrays). This has the disadvantage, however, that additional space and additional bitline lengths are needed for a DRAM memory matrix. Depending on the way of twisting, crosstalk between bitlines is merely reduced, but not eliminated. Further, when twisting, the structure of the memory matrix is complicated, which makes an analysis and a test of the memory more difficult.

The publication US 2006/0159002 A1 discloses an algorithm for eliminating crosstalk between adjacent lines. This algorithm, however, necessitates a precise knowledge of the undisturbed aggressor signal, i.e., the signal causing the interference.

Thus, an improved concept for reducing or eliminating crosstalk between adjacent lines without the above-mentioned disadvantages would be desirable.

SUMMARY OF THE INVENTION

According to an embodiment, the present invention provides a device for reducing mutual crosstalk of a signal routed across a first line and a second signal routed across a second line, wherein by the mutual crosstalk at an output of the first line a first interfered signal may be obtained and at an output of the second signal line a second interfered signal may be obtained, having a modifier for modifying the first interfered signal which is interfered by crosstalk due to the second signal, and for modifying the second interfered signal which is interfered by crosstalk due to the first signal, wherein the modifier is adapted to model an interference due to the mutual crosstalk, and a combiner for combining the first interfered signal with the modified second interfered signal to obtain a first corrected signal and for combining the second interfered signal with the modified first interfered signal to obtain a second corrected signal.

According to another embodiment, the present invention provides a device for reducing mutual crosstalk of a first signal from a first signal source routed across a first line and a second signal from a second signal source routed across a second line, wherein by the mutual crosstalk at an output of the first line a first interfered signal may be obtained and at an output of the second signal line a second interfered signal may be obtained, having a first modifier for modifying the first interfered signal which is interfered by crosstalk due to the second signal, wherein the first modifier comprises a first filter which is adapted to model a crosstalk from the first routed signal to the second routed signal, a second modifier for modifying the second interfered signal which is interfered by crosstalk due to the first signal, wherein the second modifier comprises a second filter which is adapted to model a crosstalk from the second routed signal to the first routed signal, a first subtracter for subtracting the modified second interfered signal from the first interfered signal to obtain a first corrected signal, and a second subtracter for subtracting the modified first interfered signal from the second interfered signal to obtain a second corrected signal.

According to another embodiment, the present invention provides a device for reducing mutual crosstalk of a first signal routed across a first line and a second signal routed across a second line, wherein by the mutual crosstalk at an output of the first line a first interfered signal may be obtained and at an output of the second signal line a second interfered signal may be obtained, having a first signal input for the first interfered signal which is interfered by crosstalk due to the second signal, a second signal input for the second interfered signal which is interfered by crosstalk due to the first signal, a first signal modifier comprising an input coupled to the first signal input and comprising an output for a first modified interfered signal, a second signal modifier comprising an input coupled to the second signal input and comprising an output for a second modified interfered signal, a first signal combiner coupled to the first signal input and the output of the second signal modifier and comprising an output for a first corrected signal, and a second signal combiner coupled to the second signal input and the output of the first signal modifier and comprising an output for a second corrected signal.

According to another embodiment, the present invention provides a method for reducing mutual crosstalk of a first signal routed across a first line and a second signal routed across a second line, wherein by the mutual crosstalk at an output of the first line a first interfered signal may be obtained and at an output of the second signal line a second interfered signal may be obtained, with the steps of modifying the first interfered signal which is interfered by crosstalk due to the second signal and for modifying the second interfered signal which is interfered by crosstalk due to the first signal, wherein when modifying an interference due to the mutual crosstalk is modeled, and combining the first interfered signal with the modified second interfered signal to obtain a first corrected signal and for combining the second interfered signal with the modified first interfered signal to obtain a second corrected signal.

According to another embodiment, the present invention provides a computer program for performing the above mentioned method, when the computer program runs on a computer and/or a microcontroller.

Thus, embodiments of the present invention have the advantage that an elimination or significant reduction, respectively, of crosstalk between adjacent lines, in particular bitlines, may be achieved practically without or with a very low loss of speed or performance, respectively. Further, in the inventive concept, no knowledge of an original aggressor signal is necessary for reconstructing the sacrificial signal.

BRIEF DESCRIPTION OF THE DRAWINGS

In the following, embodiments of the present invention are explained in more detail with reference to the accompanying drawings, in which.

DETAILED DESCRIPTION OF ILLUSTRATIVE EMBODIMENTS

Figure 1:
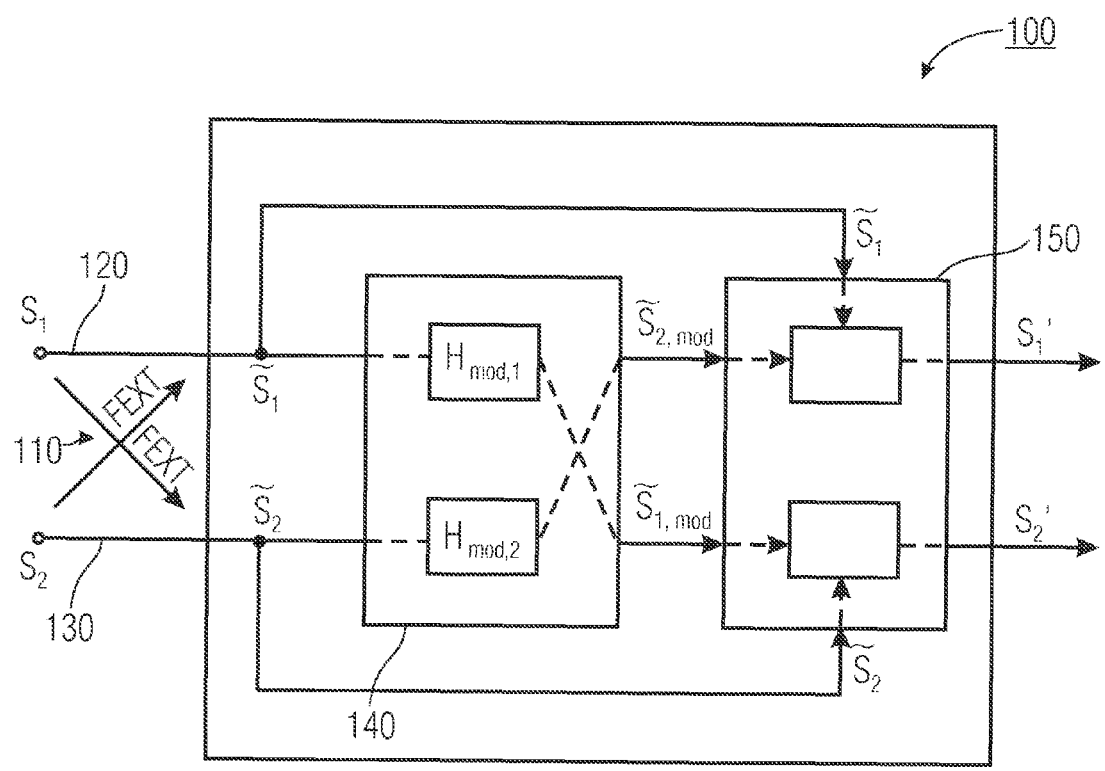
FIG. 1 shows a block diagram of a device for reducing mutual crosstalk according to one embodiment of the present invention.

With regard to the following specification it should be noted that in the different embodiments the same or seemingly the same functional elements have the same reference numerals, and thus the description of these functional elements is interchangeable in the different embodiments which are illustrated in the following.

FIG. 1 shows a device 100 for reducing mutual crosstalk 110 of a first signal $s_1$ routed across a first line 120 and a second signal $s_2$ routed across a second line 130, wherein due to the mutual crosstalk 110 a first interfered signal $\tilde{s}_1$ may be obtained at an output of the first line 120, and wherein a second interfered signal $\tilde{s}_2$ may be obtained at an output of the second line 130.

The device 100 includes a modifier 140 for modifying the first interfered signal $\tilde{s}_1$, interfered by crosstalk due to the second signal $s_2$, and for modifying the second interfered signal $\tilde{s}_2$, interfered by crosstalk due to the first signal $s_1$, wherein the modifier 140 is adapted to model an interference due to the mutual crosstalk 110.

Further, the device 100 includes a combiner 150 for combining the first interfered signal $\tilde{s}_1$ with a second interfered signal $\tilde{s}_{2,mod}$ modified by the modifier 140 to obtain a first corrected signal $s_1'$ and for combining the second interfered signal $\tilde{s}_2$ with a first interfered signal $\tilde{s}_{1,mod}$ modified by the modifier 140 to obtain a second corrected signal $s_2'$.

The crosstalk 110, which may in particular be a so-called far-end cross-talk (FEXT=far-end cross-talk) may, depending on the circuit design, be a balanced or unbalanced crosstalk. An unbalanced crosstalk here means, that a transmission characteristic $H_{FEXT,12}(f)$ of the crosstalk from the first line 120 onto the second line 130 is basically different from a transmission characteristic $H_{FEXT,21}(f)$ of the crosstalk from the second line 130 onto the first line 120. Usually, however, an approximately balanced crosstalk may be assumed. This means, that the two transmission characteristics $H_{FEXT,12}(f)$ and $H_{FEXT,21}(f)$ are at least approximately identical, i.e. $H_{FEXT,12}(f) \approx H_{FEXT,21}(f)$.

Figure 2:
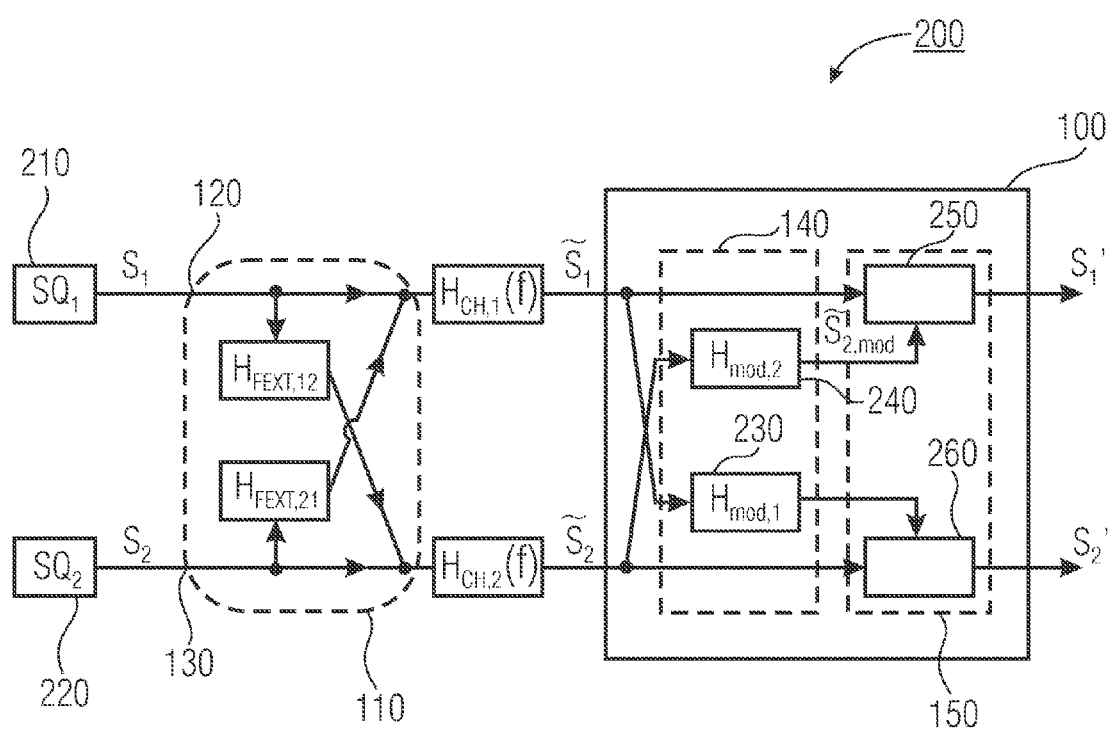
FIG. 2 shows a schematical block diagram of a transmission system having two lines and a device for reducing mutual crosstalk according to a first embodiment of the present invention.

FIG. 2 shows a schematical block diagram of a system 200 for transmitting a first signal $s_1$ and a second signal $s_2$ with a device 100 according to an embodiment of the present invention. FIG. 2 illustrates a simplified but comparable illustration of a situation in a DRAM bitline matrix.

The system illustrated in FIG. 2 shows the general case of unbalanced crosstalk, i.e., $H_{FEXT,12}(f) \neq H_{FEXT,21}(f)$. The signal $s_1$ is sent from a first signal source 210 across a first line 120. The second signal $s_2$ is sent from a second signal source 220 across a second line 130. The first signal $s_1$ couples with a crosstalk characteristic $H_{FEXT,12}(f)$ from the first line 120 across to the second line 130. Conversely, the second signal $s_2$ with a crosstalk characteristic $H_{FEXT,21}(f)$ couples from the second line 130 across to the first line 120. This is, as already described above, near-end crosstalk 110 of the signals close to their respective signal sources 210 or 220, respectively. The first signal and the over-coupled second signal are transmitted via the first line 120 with a transmission characteristic $H_{CH,1}(f)$, so that at an output of the first line 120 a first interfered signal $\tilde{s}_1$ may be obtained. The second signal $s_2$ is transmitted together with the over-coupled signal $s_1$ across the second line with the transmission characteristic $H_{CH,2}(f)$, so that at an output of the second line 130 a second interfered signal $\tilde{s}_2$ may be obtained.

The first interfered signal $\tilde{s}_1$ is supplied to a first signal input of the device 100, the second interfered signal $\tilde{s}_2$ is supplied to a second signal input of the device 100. The device 100 comprises a first signal modifier 230 with a transmission characteristic $H_{mod,1}(f)$, whose input is coupled to the first signal input of the device 100. Further, the device 100 comprises a second signal modifier 240 with a transmission characteristic $H_{mod,2}(f)$, whose input is coupled to the second signal input of the device 100. An output of the second signal modifier 240 is coupled to a first signal combiner 250, wherein the first signal combiner 250 is further connected to the first signal input of the device 100, i.e. to the first interfered signal $\tilde{s}_1$. At an output of the first signal combiner 250 the first corrected signal $s_1'$ may be obtained. An output of the first signal modifier 230 is coupled to a second signal combiner 260, wherein the second signal combiner is further connected to the second signal input of the device 100, i.e. to the second interfered signal $\tilde{s}_2$, and wherein at its output the corrected signal $s_2'$ may be obtained.

According to embodiments, the first signal modifier 230 is adapted to model the transmission characteristic $H_{FEXT,12}(f)$ of the crosstalk from the first line 130 to the second line 120. The second signal modifier 240 is adapted to model the transmission characteristic $H_{FEXT,21}(f)$ of the crosstalk from the second line 120 onto the first line 130. If the first signal modifier 230 models the transmission characteristic $H_{FEXT,12}(f)$ with the correct sign, i.e. $H_{mod,1}(f)=H_{FEXT,12}(f)$, then, according to embodiments, the second signal combiner 260 comprises a subtracter to subtract the modified first interfered signal $\tilde{s}_{1,mod}$ from the second interfered signal $\tilde{s}_2$. The same holds true for the second signal modifier 240 and the first signal combiner 250.

In case the first signal modifier 230 models the transmission characteristic $H_{FEXT,12}(f)$ with the opposing sign, i.e. $H_{mod,1}(f)=-H_{FEXT,12}(f)$, then the second signal combiner 260, according to embodiments, comprises an adder to add the second interfered signal $\tilde{s}_2$ and the modified first interfered signal $\tilde{s}_{1,mod}$, to obtain the corrected second signal $s_2'$. The same holds true for the second signal modifier 240 and the first signal combiner 250.

For reasons of clarity, in FIG. 2 only two single-ended signal lines 120, 130 are shown, and it is assumed that the undisturbed signals $s_1$, $s_2$ are fed in on one side of the signal lines 120, 130 and that the interfered signals $\tilde{s}_1$ and $\tilde{s}_2$ are received at the other end or output, respectively, of the signal lines 120, 130. For calculations of the scenario illustrated in FIG. 2, it may be assumed that the two undisturbed signals $s_1$, $s_2$ are transmitted on the transmitter side to the receiver or the device 100, respectively, via an RC network. Here, the RC network models the lines and the capacitive coupling between the lines. This is a very general situation which is in no way limited to the case of bitlines in a DRAM circuit.

For the case of a balanced crosstalk, i.e., that the transmission characteristic $H_{FEXT,12}(f)$ of the crosstalk from the first line 120 to the second line 130 is equal to the transmission characteristic $H_{FEXT,21}(f)$ of the crosstalk from the second line 130 to the first line 120, i.e.:

$$H_{FEXT,12}(f)=H_{FEXT,21}(f)=H_{FEXT}(f), \quad (1)$$

and that the transmission characteristics of the first line and the second line are at least approximately identical, i.e.

$$H_{CH,1}(f)=H_{CH,2}(f)=H_{CH}(f), \quad (2)$$

it is to be illustrated in the following how a transmission characteristic $H_{mod,1}(f)$ of the first 230 or $H_{mod,2}(f)$ of the second signal modifier 240 is to be set, respectively. Here, for reasons of clarity, the following considerations take place in the frequency range.

The first interfered signal $\tilde{s}_1(f)$ at the output of the first line 120 may be stated as follows considering the above considerations:

$$\tilde{s}_1(f)=H_{CH}(f)[S_1(f)+H_{FEXT}(f)S_2(f)] \quad (3)$$

Accordingly, the second interfered signal $\tilde{s}_2(f)$ at the output of the second line 130 may be determined to be:

$$\tilde{s}_2(f)=H_{CH}(f)[S_2(f)+H_{FEXT}(f)S_1(f)] \quad (4)$$

The modified second interfered signal at the output of the second signal modifier 240 may thus be determined to be $$S_{2,mod}(f)=H_{mod,2}(f)H_{CH}(f)\cdot[S_2(f)+H_{FEXT}(f)S_1(f)] \quad (5)$$

It is assumed that the first signal combiner 250 comprises an adder, and so for the first corrected signal $s_1'$ the following condition results:

$$S_1'(f) = \tilde{S}_1(f) + \tilde{S}_{2,mod}(f) \stackrel{!}{=} const \cdot S_1(f) \quad (6)$$

The first corrected signal $S_1'(f)$, in case of a complete elimination of the crosstalk from the second line to the first line, is thus only a multiple of the first signal $S_1(f)$ fed in from the first signal source 210. If thus equations 3 and 5 are inserted into equation 6, the following results:

$$H_{ch}\cdot S_1+H_{ch}\cdot H_{FEXT}S_2+H_{mod,2}H_{FEXT}H_{CH}S_1=const\cdot S_1(f) \quad (7)$$

wherein, for reasons of clarity, the dependence on the frequency f was omitted.

To fulfill the condition on the right side of equation (7)

$$H_{CH}H_{FEXT}S_2 + H_{mod,2}H_{CH}S_2 \stackrel{!}{=} 0 \quad (8)$$

has to apply. From this, for the transmission characteristic $H_{mod,2}(f)$ of the second signal modifier 240 the following results:

$$H_{mod,2}(f) = -H_{NEXT}(f). \quad (9)$$

The above-performed calculation may in the same way take place for the transmission characteristic $H_{mod,1}(f)$ of the first signal modifier 230, so that for a balanced crosstalk the following holds true:

$$H_{mod,1}(f) = H_{mod,2}(f) = -H_{FEXT}(f) \quad (10)$$

If it is assumed that the first and second signal combiners 250, 260 respectively comprise subtracters, accordingly the following results:

$$H_{mod,1}(f) = H_{mod,2}(f) = H_{FEXT}(f). \quad (11)$$

Figure 3:
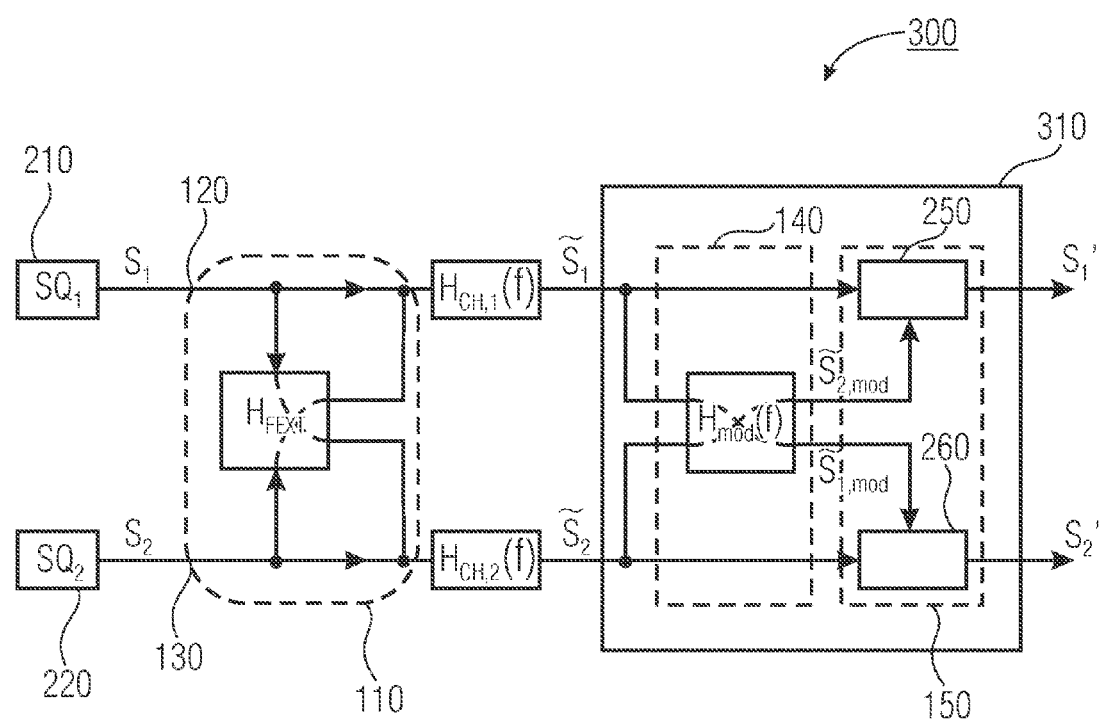
FIG. 3 shows a schematical block diagram of a transmission system having two lines and a device for reducing mutual crosstalk according to a second embodiment of the present invention.

In case of balanced crosstalk, the two transmission characteristics $H_{mod,1}(f)$ and $H_{mod,2}(f)$ are also identical. For the case of balanced crosstalk, thus one modifier is sufficient for the two interfered signals $\tilde{s}_1$ and $\tilde{s}_2$ to obtain the corrected signals $s_1'$ and $s_2'$ at the output of the device 100, as it is illustrated in FIG. 3. As a person skilled in the art may easily check, in the general case, i.e., with an unbalanced crosstalk and different transmission characteristics of the first line 120 and the second line 130 the following connection results for the transmission characteristics of the first and the second signal modifiers 230, 240

$$H_{mod,1}(f) = -H_{FEXT,12}(f) \frac{H_{CH,2}(f)}{H_{CH,1}(f)}, \quad (12)$$

$$H_{mod,2}(f) = -H_{FEXT,21}(f) \frac{H_{CH,1}(f)}{H_{CH,2}(f)}. \quad (13)$$

For the following description, for reasons of clarity it is to be assumed that the mutual crosstalk is balanced crosstalk and that all lines have the same transmission functions. An embodiment of the present invention is, however, as already described above, in no way limited to balanced crosstalk and equal transmission functions.

For the case that the first and second signal sources 210 and 220 respectively comprise capacities, as, for example, it occurs with memory capacities in the DRAM memory cells, then in connection with a capacitive coupling between the first line 120 and the second line 130 a transmission characteristic $H_{FEXT}(f)$ of the mutual crosstalk results which is virtually frequency-independent for frequencies $f>0$, i.e., $H_{FEXT}(f)=k$ for $f>0$. For this case, the modifier 140 may be adapted to respectively attenuate the first interfered signal $\tilde{s}_1$ and the second interfered signal $\tilde{s}_2$ with one attenuator, wherein for frequencies greater than zero a frequency characteristic of the attenuator has a flat course in a predetermined range, i.e., fluctuates in the predetermined range by ±20% around an attenuation mean value k.

If, in other words, the transmission characteristic of crosstalk is $H_{FEXT}(f)=k$ for $f>0$, wherein $k<1$, then for the transmission characteristic $H_{mod}(f)$ of the first and/or the second signal modifier 230, 240 $H_{mod}(f)=\pm k$ for $f>0$, depending on whether the first and second signal combiners 250, 260 comprise subtracters or adders. According to embodiments, the first signal modifier 230 and/or the second signal modifier 240 is a resistive attenuator. According to further embodiments, the attenuator may also be a frequency-dependent attenuator, like, for example, low, band or high pass. For the case of a high pass-like capacitive coupling between the two lines 120 and 130, the modifier 140 comprises a similar high pass.

If the mutual crosstalk $H_{FEXT}(f)$ between the two lines 120, 130 has a frequency-dependent characteristic, then the modifier 140, according to embodiments, comprises at least one filter which is adapted to model the frequency-dependent crosstalk $H_{FEXT}(f)$ from the first routed signal to the second routed signal and/or vice versa, i.e. $H_{mod}(f)=\pm H_{FEXT}(f)$. Here, a filter characteristic $H_{mod}(f)$ of the filter may be firmly set based on the frequency-dependent crosstalk $H_{FEXT}(f)$. With an analog filter, this, for example, takes place by components of the filter which are firmly tuned with regard to each other. With a digital filter, which may, for example, be implemented in a so-called tapped delay line structure, this means firmly set filter coefficients. Firmly set filter characteristics of filters in the modifier 140 are, for example, advantageous with balanced crosstalk if the transmission characteristic $H_{FEXT}(f)$ or with unbalanced crosstalk the transmission characteristic $H_{FEXT,12}(f)$ and $H_{FEXT,21}(f)$, respectively, do not or only insignificantly change over time.

Typically, mutual crosstalk between the first line 120 and the second line 130 will change over time, for example, due to components heating up, etc. In this case, with a firmly set filter characteristic in the first signal modifier 230 and/or the second signal modifier 240 only an insufficient elimination of crosstalk may be achieved. Thus, according to embodiments, a filter characteristic of a filter of the first signal modifier 230 and/or the second signal modifier 240 is variable to be able to model changes of the frequency-dependent crosstalk $H_{FEXT}(f)$ from the first routed signal to the second routed signal and/or vice versa. This means, that the transmission functions $H_{mod,1}(f)$ and/or $H_{mod,2}(f)$ are variable.

Figure 4:
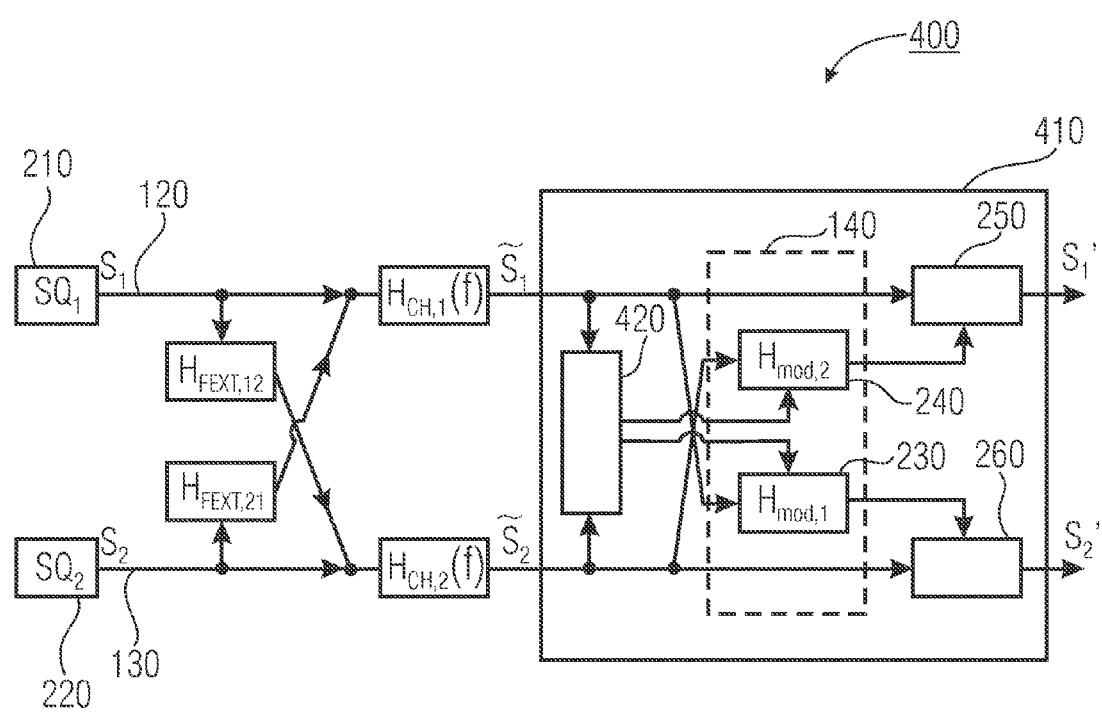
FIG. 4 shows a schematical block diagram of a transmission system having two lines and a device for reducing mutual crosstalk according to a third embodiment of the present invention.

FIG. 4 shows a block diagram of a system 400 for transmitting a first signal $s_1$ from a first signal source 210 and a second signal $s_2$ from a second signal source 220 to a device 410 for reducing the mutual crosstalk.

Compared to the device 100 illustrated in FIG. 2, the device 410 illustrated in FIG. 4 further comprises a means 420 for setting the modifier 140. According to one embodiment, the first transmission characteristic $H_{FEXT,12}(f)$ of the crosstalk from the first signal line to the second signal line is determined such that a first signal $s_1$ is sent from the first signal source 210 across the first line 120 and no signal is sent from the second signal source 220 to the second line 130. The means 420 for setting the modifier 140 forms a quotient for this purpose from the second interfered signal $\tilde{s}_2$ and the first interfered signal $\tilde{s}_1$, i.e., $\tilde{s}_2/\tilde{s}_1$, to obtain the first transmission characteristic $H_{FEXT,12}(f)$. In case of balanced crosstalk, the thus determined first transmission characteristic $H_{FEXT,12}(f)$ also corresponds to the second transmission characteristic from the second line 130 to the first line 120 $H_{FEXT,21}(f)$.

In case of unbalanced crosstalk, the second transmission characteristic $H_{FEXT,21}(f)$ of the crosstalk from the second signal line 130 onto the first signal line 120 may be determined such that a second signal $s_2$ is sent from the second signal source 220 and no signal is sent from the first signal source 210 and that the means 420 for setting forms a quotient from the resulting first interfered signal $\tilde{s}_1$ and the second interfered signal $\tilde{s}_2$, i.e. $\tilde{s}_1/\tilde{s}_2$, to obtain the second transmission characteristic $H_{FEXT,21}(f)$.

With the thus determined transmission functions or transmission characteristics, respectively, of crosstalk, filter characteristics of the first and second signal modifiers 230, 240 may be set accordingly.

If the inventive device 410 is, for example, used in a DRAM memory chip, then the above-described training for determining the transmission characteristics of the crosstalk may, for example, be performed when the DRAM memory chip is currently not accessed.

There are, of course, other possibilities for setting the filters of the modifier 140. For example, adaptive methods may be used which are based on an evaluation of the corrected signals $s_1'$, $s_2'$ and, for example, on their signal dynamics.

Figure 5:
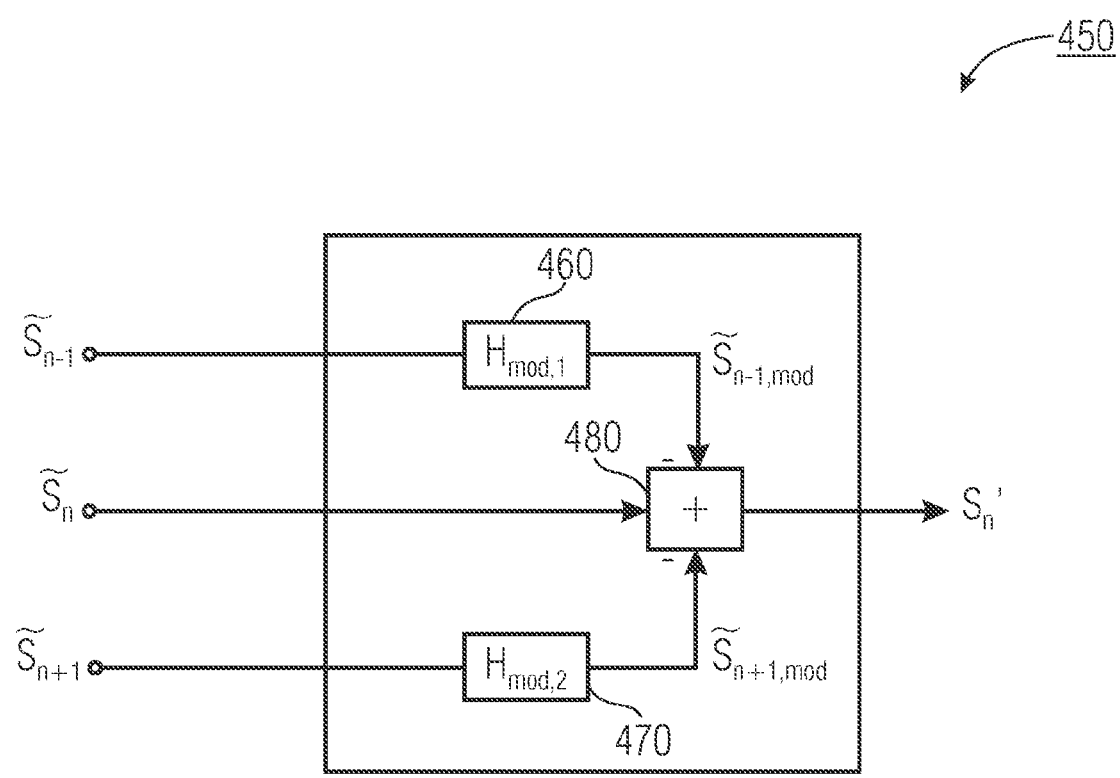
FIG. 5 shows a schematical block diagram for illustrating a reduction of crosstalk of two adjacent lines according to an embodiment of the present invention.

Frequently, a line not only has one directly adjacent line, but in addition has a second directly adjacent line, which also generates crosstalk. A device 450 which may respectively eliminate or reduce, respectively, balanced crosstalk from two adjacent lines is illustrated in FIG. 5. Here, the device 450 is a consequent extension of the inventive devices already described with reference to FIGS. 1 to 4.

FIG. 5 shows a device 450 for reducing mutual crosstalk of three routed signals which comprises a first modifier 460 for modifying a first interfered adjacent signal $\tilde{s}_{n-1}$ and a second modifier 470 for modifying a second interfered adjacent signal $\tilde{s}_{n+1}$ to the interfered signal $\tilde{s}_n$. Further, the device 450 comprises a combiner 480 for combining the modified first interfered adjacent signal $\tilde{s}_{n-1,mod}$ with the interfered signal $\tilde{s}_n$ and the modified second interfered adjacent signal $\tilde{s}_{n+1,mod}$, to obtain a corrected signal $s_n'$. The first modifier 460 is adapted to model crosstalk of the first adjacent signal $\tilde{s}_{n-1}$ to the signal $s_n$, and the second modifier 470 is adapted to model crosstalk from the second adjacent signal $\tilde{s}_{n+1}$ to the signal $s_n$. Here, for reasons of clarity, again balanced crosstalk is assumed from the first adjacent signal $s_{n-1}$ to the signal $s_n$ and from the second adjacent signal $s_{n+1}$ to the signal $s_n$. An extension of the circuit to unbalanced crosstalk should not be difficult for a person skilled in the art with the use of the above specification.

Figure 6:
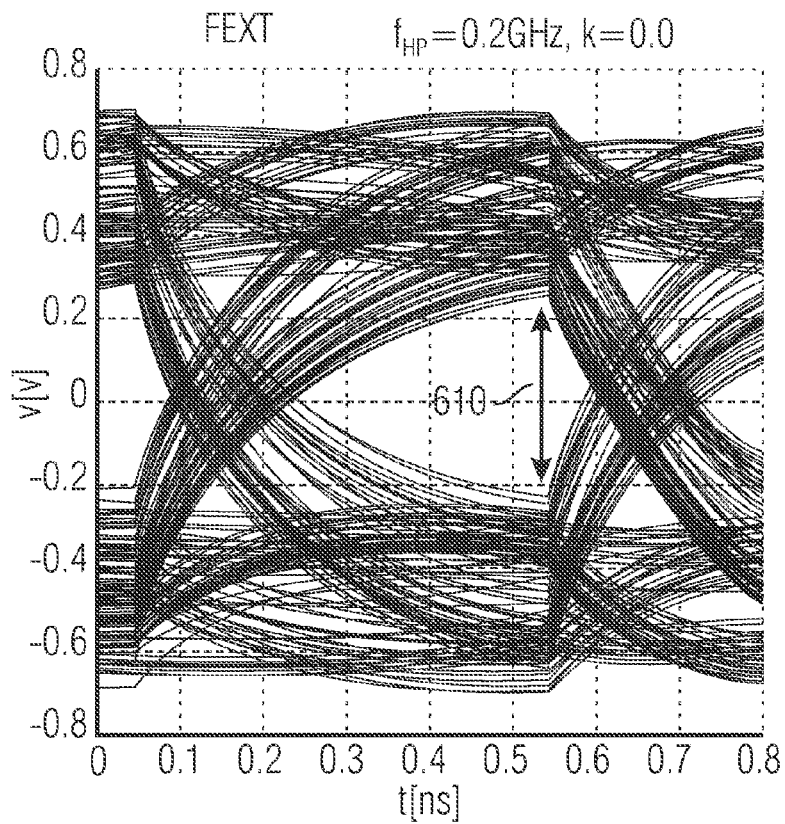
FIG. 6 shows an illustration of eye diagrams with and without a reduction of crosstalk according to embodiments of the present invention.
Figure 6:
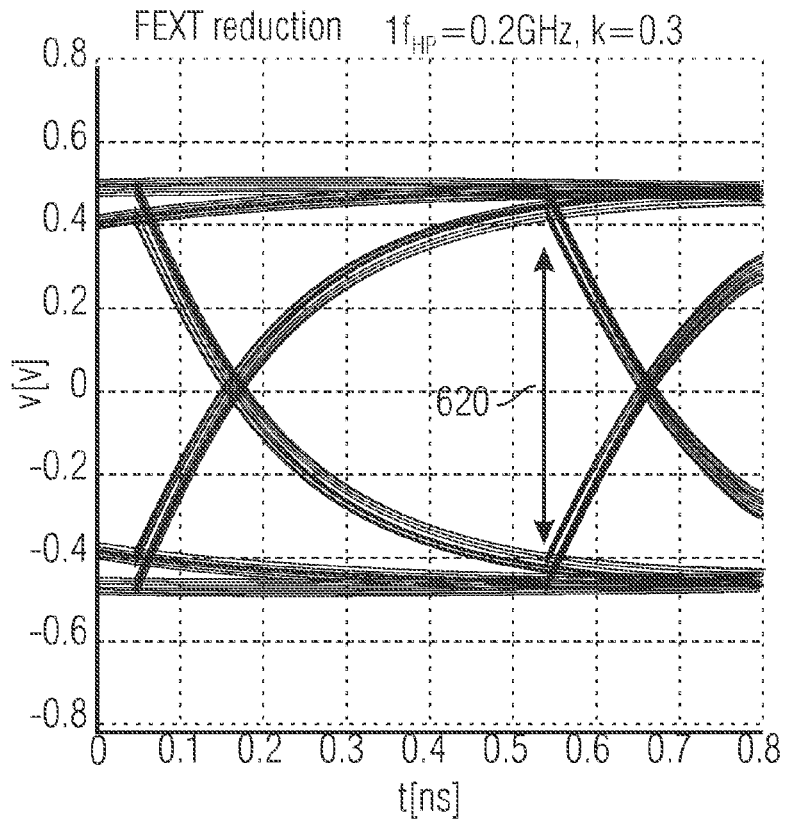

FIG. 6 shows two eye diagrams of a simulated signal transmission in a simplified system, as it is, for example, illustrated in FIGS. 2 to 4.

The top of FIG. 6 shows an eye diagram of a transmission of a first signal $s_1$ from a first signal source with one capacity and a second signal $s_2$ from a second signal source with one capacity. As it was described above, DRAM memory cells comprise memory capacities and may thus be simulated as signal sources with capacities. Between the two adjacent bitlines 120, 130 a capacitive coupling is predominant which comprises in the illustrated case a high pass characteristic with a cutoff frequency $f_{HP}$ of 0.2 GHz gigahertz. As already described above, in such a case a frequency-independent transmission characteristic of the mutual crosstalk may be assumed. This means, the crosstalk $H_{FEXT}(f)$ may be simulated by a constant coupling factor k. If, for example, crosstalk is 30%, i.e. k=0.3, and if this crosstalk is not compensated, the eye diagram illustrated on the top of FIG. 6 results. The length of the double arrow designated by the reference numeral 610 may be interpreted as a measure for a signal-to-noise ratio (SNR) of an interfered signal $\tilde{s}_1$, $\tilde{s}_2$ at the output of a signal line 120, 130.

The bottom of FIG. 6 shows an eye diagram as it results if a coupling coefficient k=0.3 is assumed with a capacitive coupling simulated by a high pass with a cutoff frequency $f_{HP}$=0.2 GHz between the first signal line 120 and the second signal line 130. A constant coupling coefficient may approximately be assumed when the signal sources 210 and 220 also comprise capacities. If on the receiver side, i.e., at the outputs of the signal lines 120, 130, an inventive device 100, 310, 410 for reducing or eliminating crosstalk, respectively, is used, the eye diagram illustrated on the bottom of FIG. 6 may result. The length of the double arrow designated by the reference numeral 620 is again a measure for the signal-to-noise ratio after the suppression of the crosstalk, i.e., at the output of the device 100 or 310, respectively. By a comparison with the left-hand part of FIG. 6, it is obvious for a person skilled in the art that by the use of the inventive concept a clear increase of the signal-to-noise ratio may be achieved on the receive side.

Figure 7:
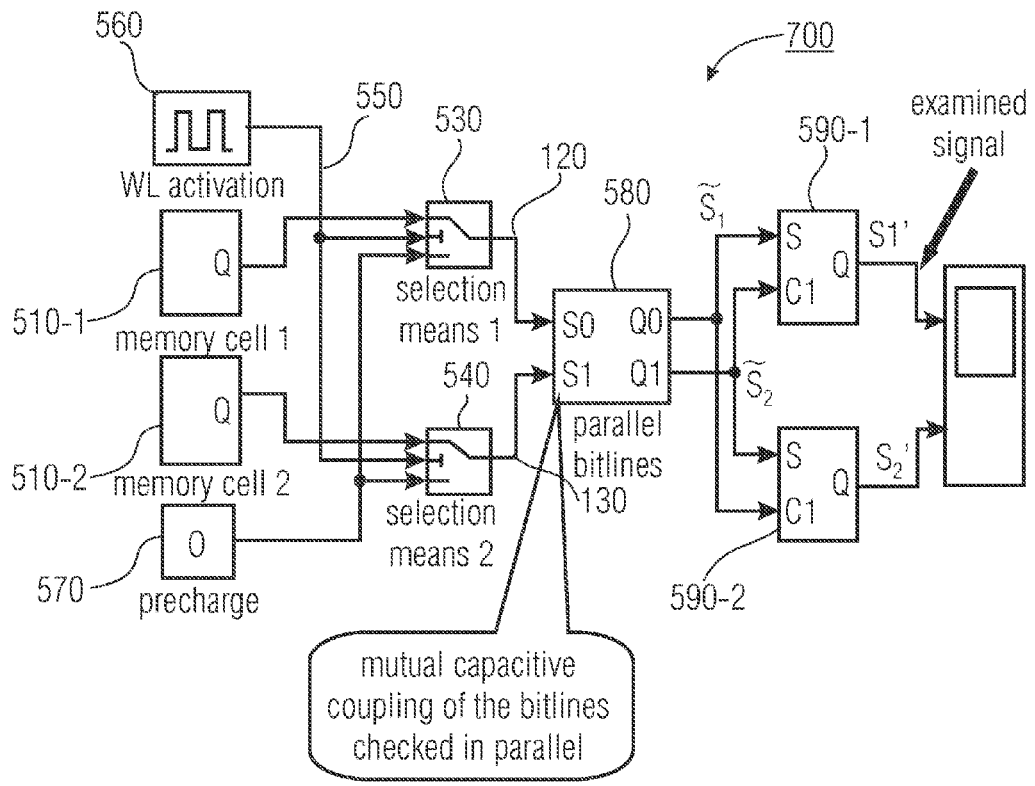
FIG. 7 shows a schematical block diagram of a memory matrix with two memory cells for illustrating the inventive concept.

FIG. 7 shows a simplified memory model 700 with two memory cells 510-1, 510-2 and so-called single-ended lines.

The memory cells 510-1 and 510-2 acting as signal sources are respectively coupled to a selection means 530 and 540. Further, a word line activation line 550 leads from a word line activation means 560 into each of the two selection means 530 and 540. Further, FIG. 7 shows a precharge circuit 570 which is connected to both selection means 530 and 540 via a precharge line. On the output side, the two selection means 530 and 540 are connected to a means 580 in which a first signal line 120 and a second signal line 130 are routed in parallel to supply the same on the output side to a first 590-1 and a second 590-2 elimination amplifier or elimination receiver, respectively.

At a first input of the means 580 an undisturbed first signal $s_1$ of the first memory cell 510-1 is applied, whereas at a second input of the means 580 a second undisturbed signal $s_2$ of the second memory cell 510-2 is applied. At a first output of the means 580 a first interfered signal $\tilde{s}_1$ is applied, wherein at a second output of the means 580 a second interfered signal $\tilde{s}_2$ is applied. Both the first interfered signal $\tilde{s}_1$ and also the second interfered signal $\tilde{s}_2$ are supplied to the two elimination receivers 590-1 and 590-2 to respectively obtain a first corrected signal $s_1'$ and a second corrected signal $s_2'$ at their outputs. The elimination receivers 590-1 and 590-2 illustrated in FIG. 7 thus respectively comprise a modifier and a combiner, as already described above, to obtain the respectively corrected signal at their outputs. In contrast to conventional read amplifiers, the elimination amplifiers 590-1 and 590-2 thus additionally comprise an input for the respective adjacent signal.

Although in FIG. 7 for reasons of clarity only one unbalanced or single-ended line routing is illustrated, respectively, with actually implemented DRAM memory systems in general a differential or pseudo-differential line routing, respectively, is used. The routing is pseudo-differential because the routing and signal evaluation are differential but not the signal itself. The principle of the present invention is not affected by this.

Figure 8:
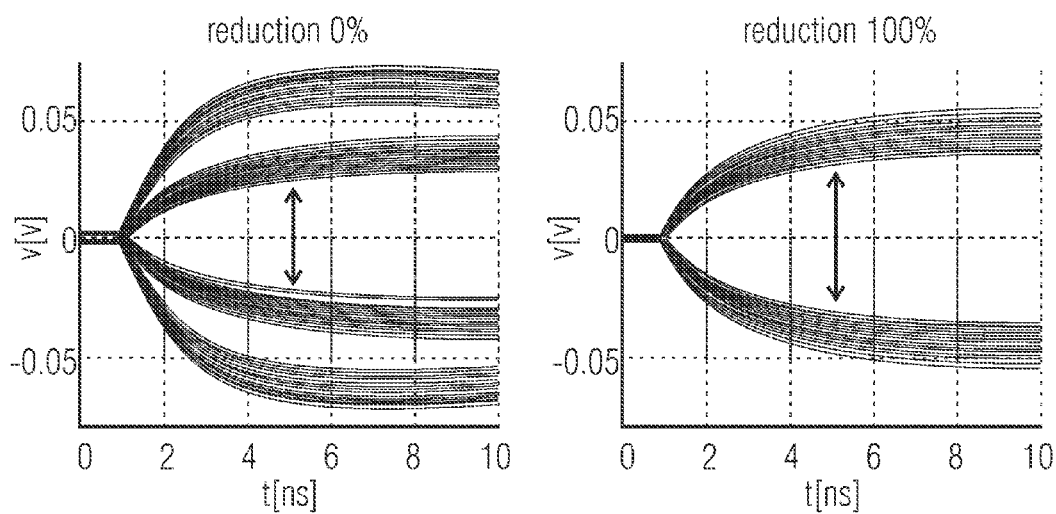
FIG. 8 shows an illustration of signal-to-noise power ratios with and without a reduction of crosstalk in the system illustrated in FIG. 7.

If it is assumed that an activation signal is sent across the line 550 at a time t=1 ns (ns=nanosecond) and that the signals sent across the first 120 and the second line 130 are read at an evaluation time t=5 ns, then with a conventional read amplifier the vertical eye opening illustrated on the left-hand side in FIG. 8 results.

In the example illustrated on the left side in FIG. 8, a vertical eye opening results with t=5 ns of $dV_{off}$=47 mVpp (mVpp=millivolts peak-to-peak) with missing reduction or elimination, respectively, of the mutual crosstalk. With a reduction of the crosstalk according to the inventive concept, the vertical eye opening illustrated on the right in FIG. 8 may result at t=5 ns, which corresponds to a voltage difference $dV_{on}$=71 mVpp compared to a reference potential.

The ambiguity of the vertical eye opening illustrated on the left in FIG. 8 results from crosstalk of equivalent bits between the two lines (great distance) or by crosstalk of opposing bits, respectively, i.e., "0" on one line, "1" on the other line (small distance).

If a sensitivity of a read amplifier of $V_{sense,min}$≈30 mV is assumed, then a voltage tolerance (dV–$V_{sense,min}$) of approx. 17 mV with a system without a compensation of the crosstalk and a voltage tolerance of approx. 41 mV with a system with a complete compensation of the crosstalk results. The inventive concept may thus provide up to 2.5 times more voltage tolerance towards additional noise and memory deficiencies.

Figure 9:
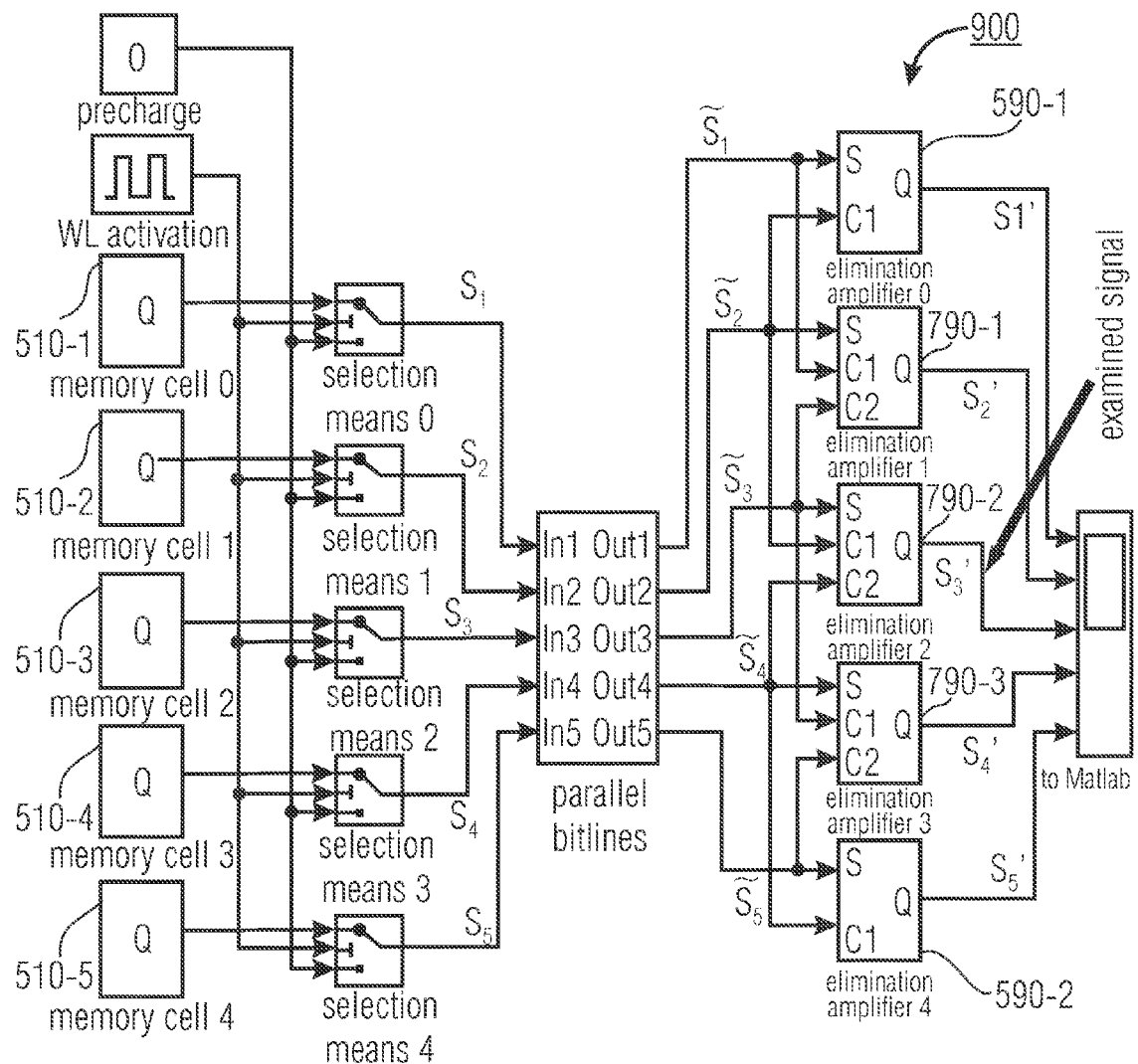
FIG. 9 shows a schematical illustration of a memory matrix having four memory cells as an application for the inventive concept.

FIG. 9 schematically illustrates a memory system having 5 memory cells and 5 elimination amplifiers which is set up similar to the memory model illustrated in FIG. 7.

The difference to the system illustrated in FIG. 7 is that in the system illustrated in FIG. 9 some signal lines respectively have two neighbors. Only the two outer signal lines for the signal $s_1$ of the first memory cell 510-1 and for the signal $s_5$ of the memory cell 510-5 only comprise one adjacent line. For this reason, also the elimination receivers 590-1 and 590-2 belonging to the first interfered signal $\tilde{s}_1$ and to the fifth interfered signal $\tilde{s}_5$ only comprise two inputs, as it is already known from FIG. 7. The other interfered signals $\tilde{s}_2, \tilde{s}_3, \tilde{s}_4$ are respectively interfered by two adjacent signals. For example, the interfered signal $\tilde{s}_2$ is interfered by the crosstalk from signal $\tilde{s}_1$ and by the crosstalk from signal $\tilde{s}_3$. Thus, the elimination receiver 790-1 comprises three inputs for $\tilde{s}_1, \tilde{s}_2$ and $\tilde{s}_3$, to be able to obtain the corrected signal $s_2'$ at its output. The same holds true for the elimination receivers 790-2 and 790-3.

The elimination receivers 790-1 to 790-3 comprise devices for reducing mutual crosstalk of three routed signals, as it was described above with reference to FIG. 5.

Figure 10:
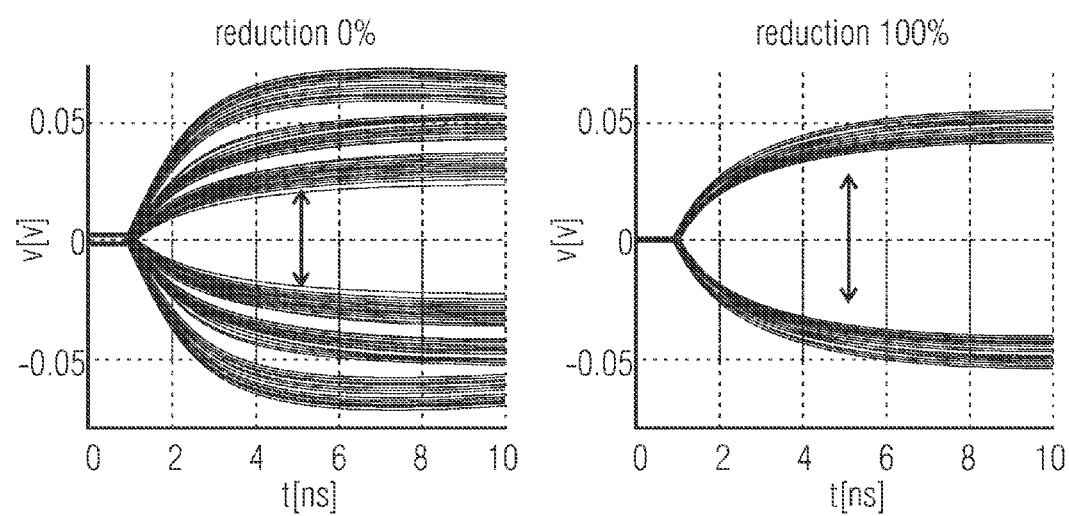
FIG. 10 shows an illustration of a signal-to-noise power ratio with and without a reduction of crosstalk in the system illustrated in FIG. 7.

On the left, FIG. 10 shows an eye diagram for a transmission without reduction or elimination, respectively, of the crosstalk of two adjacent lines, and on the right an eye diagram which results with a complete elimination of the crosstalk of two adjacent lines, as illustrated in FIG. 9. Also here, as it has already been described above, a clear increase of the signal-to-noise ratio by the inventive concept may be determined.

With DRAM-ICs, for every column typically not only one bitline but a bitline pair is present. Bitlines are also implemented differentially. The individual memory cells are here respectively alternatingly connected to one of the two bitlines. Before a beginning of a refresh cycle, all bitline pairs are precharged at the word lines to half of the supply voltage VCC/2. When applying a line address, an activation of the corresponding word line takes place. By means of transistors of the memory cells, memory capacitor charges respectively flow to a first bitline of the bitline pairs which is precharged with VCC/2. With a charged capacitor, the potential of the first bitline is slightly raised. A discharged capacitor (physical 0 stored) slightly pulls down the potential of the bitline by the charge process. The second line of the bitline pair maintains its precharged potential VCC/2. A read amplifier circuit now amplifies the potential difference of the bitline pair. With an increased potential of the first bitline, it raises the same, for example, to the supply voltage VCC, and with a decreased potential, it draws the same to mass. The second line of the bitline pair is forced to the opposing potential. This process refreshes the contents of the memory cells.

Figure 11:
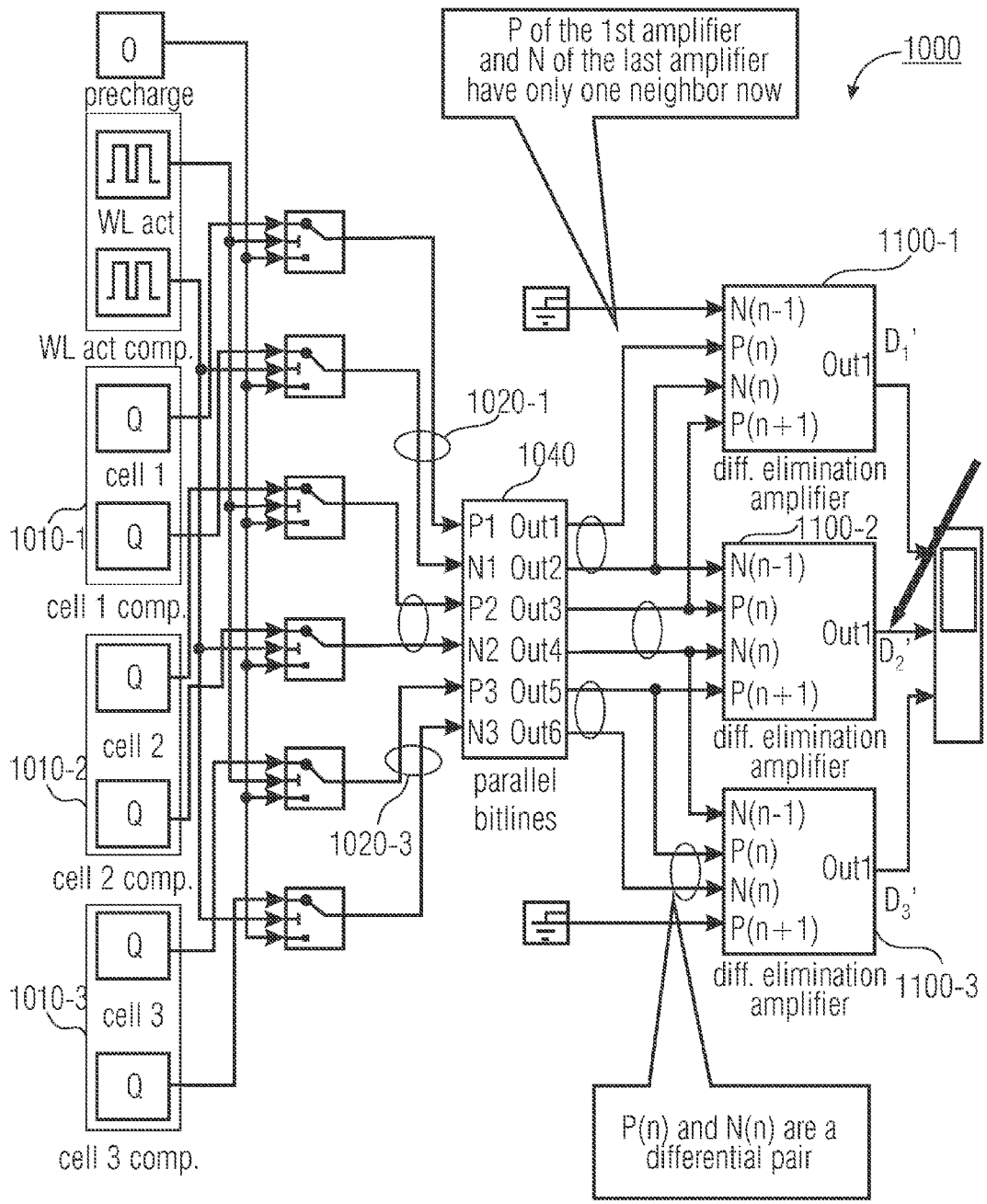
FIG. 11 shows a basic block diagram of a memory matrix having three memory cells and a differential grouping of lines according to an embodiment of the present invention.

FIG. 11 shows a schematical block diagram of a memory system 1000 with a differential line routing. In contrast to the above-described simplified memory systems, which comprise the entire unbalanced or single-ended line routing, respectively, in the system schematically illustrated in FIG. 11, an information bit may be represented by a potential difference (D) between a positive line (P) and a negative line (N), i.e., D=P−N.

Thus, the memory cells 1010-1 to 1010-3 illustrated in FIG. 11 respectively comprise one bitline pair 1020-1 to 1020-3, wherein the actual information, as was described above, is respectively only routed on one line of a bitline pair, wherein the respective other line is precharged, for example, to half the supply voltage VCC/2. In one block 1040 a first positive line P1 and a first negative line N1 for a first information bit, a second positive line P2 and a second negative line N2 for a second information bit and a third positive line P3 and a third negative line N3 for a third information bit are routed. Here, all lines are routed parallel to each other. On the output side, the first positive line P1 and the first negative line N1 and also the second positive line P2 are supplied to a first differential elimination amplifier 1100-1. The first negative line N1, the second positive line P2, the second negative line N2 and the third positive line P3 are supplied to a second differential elimination amplifier 1100-2 in the illustrated way. The second negative line N2, the third positive line P3 and the third negative line N3 are supplied to a third differential elimination amplifier 1100-3. As the first positive line P1 has no negative line of an adjacent differential information signal as an adjacent line, a reference potential is supplied to the first elimination receiver 1100-1 instead of the negative adjacent line. The same holds true for the third elimination receiver 1100-3, to which, due to a missing positive adjacent signal, a reference potential instead of a positive adjacent potential is supplied.

In case the potential difference D(n)=P(n)−N(n) is the relevant signal for the $n^{th}$ information bit, and the next adjacent aggressors for this signal are the signals N(n−1) and P(n+1), wherein a line configuration according to [ . . . , P(n−1), N(n−1), P(n), N(n), P(n+1), . . . ] is assumed and, assuming that the memory matrix is arranged fully regularly, a simple interference model results (respectively limited to the next neighbor) according to $$\tilde{D}(n)=D(n)+H_{FEXT}(f)*[N(n-1)-P(n+1)], \quad (14)$$

wherein $\tilde{D}$ designates the interfered signal and $H_{FEXT}(f)$ may be regarded as the transmission function of the crosstalk in the frequency range. A reconstructed first-order signal results in:

$$D'(n)=\tilde{D}(n)-H_{FEXT}(f)*[N'(n-1)-P'(n+1)]. \quad (15)$$

Figure 12:
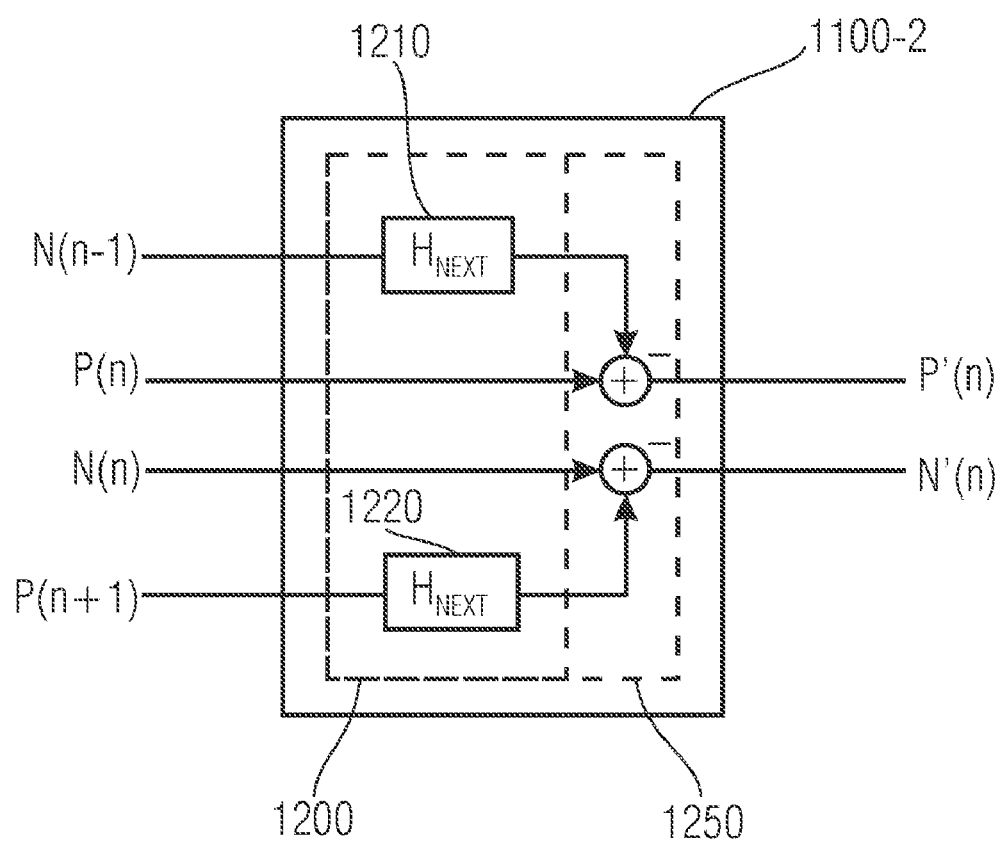
FIG. 12 shows a schematical block diagram for illustrating a reduction of crosstalk with differential line routing according to an embodiment of the present invention.

One possible realization of equation (15) by the elimination receiver 1100-2 is illustrated in FIG. 12.

An elimination receiver for differential signals, in particular the elimination receiver 1100-2, according to embodiments, comprises a means 1200 for modifying which is adapted to be connected to a first negative line N(n−1) for a first information bit and a second positive line P(n) for a second information bit, to be connected to a second negative line N(n) for the second information bit and to be connected to a third positive line P(n+1) for a third information bit. The means 1200 for modifying includes a first modifier 1210 for modifying the signal on the first negative line N(n−1) and a second modifier 1220 for modifying the signal on the third positive line P(n+1). Further, the elimination receiver 1100-2 includes a means 1250 for combining the modified signal on the first negative line N(n−1) and the signal on the second positive line P(n) and for combining the modified signal on the third positive line P(n+1) and the signal on the second negative line N(n) to obtain the corrected signals P'(n), N'(n) on the second positive and the second negative line.

Figure 13:
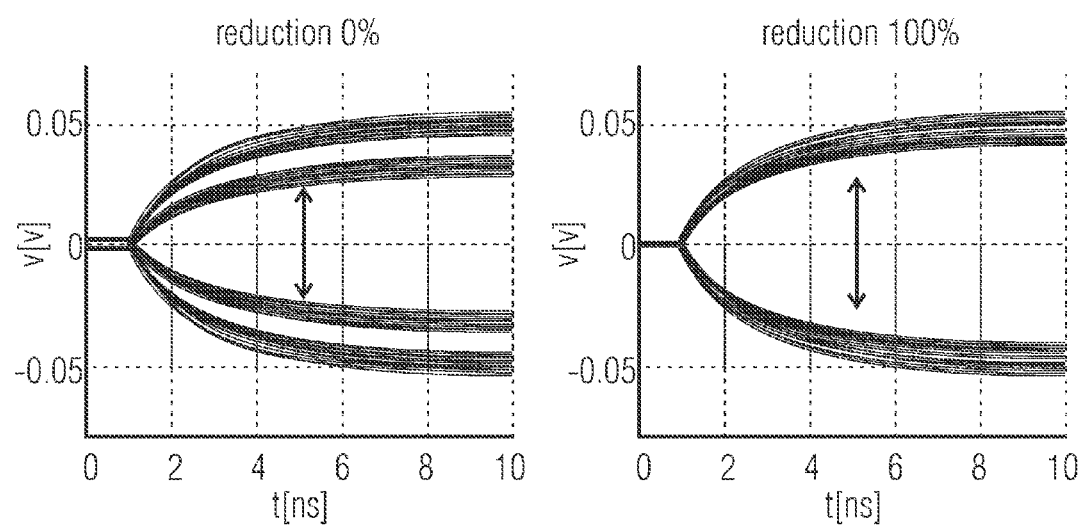
FIG. 13 shows an illustration of signal-to-noise power ratios with and without a reduction of crosstalk in the system illustrated in FIG. 9.

A possible gain with regard to a signal-to-noise ratio of the corrected signals $D_1', D_2'$ and $D_3'$ of the differential system illustrated in FIG. 11 is schematically shown in FIG. 13.

The left side of FIG. 13 exemplarily shows an eye diagram for a transmission without a reduction of the crosstalk, whereas FIG. 13 on the right shows an eye diagram for a transmission with a reduction of the crosstalk according to one embodiment of the present invention. Also here it may be seen that, with a differential line routing, a gain with regard to the signal-to-noise ratio is possible.

In summary, the present invention thus provides a concept for reducing an influence of mutual crosstalk in an information transmission across adjacent signal lines. Here, no knowledge of the undisturbed and/or interference-free aggressor signal is necessary to reconstruct the respective sacrificial signal.

With DRAM systems, in general a balanced and virtually frequency-independent (for f>0) transmission characteristic of the crosstalk between two adjacent bitlines may be assumed. This only necessitates a modification of the interfered signals with an attenuator, wherein a modified first interfered signal is subsequently stripped from a second interfered signal (unmodified) to obtain a corrected version of the second signal.

Thus, embodiments of the present invention offer the advantage that a substantial reduction of the crosstalk between signal lines may be achieved without losing system performance. In addition, only a slight modification of conventional receiver circuits is necessary, which in the case of integrated circuits only necessitates little additional chip area.

Embodiments of the present invention may be used both for improving the SNR and also for a performance increase. The latter is the case, as by the improved SNR an earlier evaluation time may be chosen, which reduces a latency.

It is further to be noted that the present invention is not limited to the respective components of the devices or the explained process, as these components and methods may vary. In particular, the present invention is not limited to memory systems, but may be used with any systems having a parallel line routing. The terms used here are only intended to describe special embodiments and are not used in a limiting way. If in the description and in the claims the singular or the indefinite article are used, the same also refers to the plural of these elements, as long as the context does not indicate otherwise. The same holds true vice versa.

In particular it is to be noted that, depending on the circumstances, the inventive method may be implemented in hardware or in software. The implementation may take place on a digital storage medium, in particular a floppy disc or a CD having electronically readable control signals which may cooperate with a programmable computer system so that the corresponding method is performed. In general, the invention thus also consists in a computer program product having a program code stored on a machine-readable carrier for performing the inventive method when the computer program product runs on a computer and/or microcontroller. In other words, the present invention is thus also a computer program having a program code for performing the method for reducing mutual crosstalk, when the computer program runs on a computer and/or a microcontroller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A device for reducing mutual crosstalk of a first signal routed across a first line and a second signal routed across a second line, wherein by the mutual crosstalk at an output of the first line a first interfered signal may be obtained and at an output of the second line a second interfered signal may be obtained, the device comprising:

a modifier for modifying the first interfered signal that is interfered by crosstalk due to the second signal based upon a first transmission characteristic and for modifying the second interfered signal that is interfered by crosstalk due to the first signal based upon a second transmission characteristic;

a combiner for combining the first interfered signal with the modified second interfered signal to obtain a first corrected signal and for combining the second interfered signal with the modified first interfered signal to obtain a second corrected signal; and a setter directly connected to the modifier for determining the first transmission characteristic of the crosstalk by, when a first signal from a first signal source is sent across the first line and no signal is sent across the second line from a second signal source, forming a quotient from the second interfered signal and the first interfered signal and for determining a second transmission characteristic of the crosstalk by, when a second signal is sent from the second signal source and no signal is sent from the first signal source, forming a quotient from the first interfered signal and the second interfered signal.

2. The device according to claim 1, wherein the modifier models a transmission characteristic of the crosstalk with a correct sign and the combiner comprises at least one subtracter to subtract the modified second interfered signal from the first interfered signal to obtain the first corrected signal, and to subtract the modified first interfered signal from the second interfered signal to obtain the second corrected signal.

3. The device according to claim 1, wherein the modifier models a transmission characteristic of the crosstalk with an opposing sign and the combiner comprises an adder to add the modified second interfered signal to the first interfered signal to obtain the first corrected signal and to add the modified first interfered signal to the second interfered signal to obtain the second corrected signal.

4. The device according to claim 1, wherein the first signal is sent from a first signal source and the second routed signal is sent from a second signal source, wherein the first signal source comprises a first capacitance and the second signal source comprises a second capacitance, and wherein the signal lines are placed with regard to each other so that a mutual crosstalk takes place above a noise threshold, and wherein the modifier is adapted to each attenuate the first interfered signal and the second interfered signal with one attenuator, wherein for frequencies greater than zero, a frequency characteristic of the attenuators each comprises a flat course in a predetermined range.

5. The device according to claim 4, wherein the first and the second signal sources each are memory cells of a DRAM memory.

6. The device according to claim 4, wherein the frequency characteristics of the attenuators each maximally fluctuate by ±20% around an attenuation mean value in the predetermined range.

7. The device according to claim 4, wherein the attenuator comprises a resistive attenuator.

8. The device according to claim 4, wherein the attenuator comprises a frequency-dependent attenuator.

9. The device according to claim 1, wherein the modifier comprises at least one filter that is adapted to model a frequency-dependent crosstalk from the first routed signal to the second routed signal, or from the second routed signal to the first routed signal, or from the first routed signal to the second rout signal and from the second rout signal to the first routed signal.

10. The device according to claim 9, wherein a filter characteristic of the filter is firmly set based on the frequency-dependent crosstalk from the first routed signal to the second routed signal, or from the second routed signal to the first routed signal, or from the first routed signal to the second rout signal and from the second rout signal to the first routed signal.

11. The device according to claim 9, wherein a filter characteristic of the filter is variable to be able to model changes of the frequency-dependent crosstalk from the first routed signal to the second routed signal, or from the second routed signal to the first routed signal, or from the first routed signal to the second rout signal and from the second rout signal to the first routed signal.

12. The device according to claim 1, wherein an information bit may be represented by a potential difference between a positive line and a negative line, wherein a first positive and a first negative line are laid for a first information bit, a second positive and a second negative line are laid for a second information bit, a third positive and a third negative line are laid for a third information bit, and wherein the modifier is adapted to be connected to the first negative line for the first information bit and to the second positive line for the second information bit, and to be connected to the second negative line for the second information bit and to the third positive line for the third information bit, wherein the device further comprises an information receiver that is adapted to form a difference from a corrected second positive signal and a corrected second negative signal to receive the second information bit.

13. The device according to claim 12, wherein the modifier is adapted to modify the interfered signal of the first negative line that is interfered by crosstalk due to a signal of the second positive line, and to modify an interfered signal of the third positive line that is interfered by crosstalk due to a signal of the second negative line.

14. A device for reducing mutual crosstalk of a first signal from a first signal source routed across a first line and a second signal from a second signal source routed across a second line, wherein by the mutual crosstalk at an output of the first line a first interfered signal may be obtained and at an output of the second line a second interfered signal may be obtained, the device comprising:
a first modifier for modifying the first interfered signal that is interfered by crosstalk due to the second signal by a first transmission characteristic, wherein the first modifier comprises a first filter that is adapted to model a crosstalk from the first routed signal to the second routed signal;
a second modifier for modifying the second interfered signal that is interfered by crosstalk due to the first signal by a second transmission characteristic, wherein the second modifier comprises a second filter that is adapted to model a crosstalk from the second routed signal to the first routed signal;
a first subtracter for subtracting the modified second interfered signal from the first interfered signal to obtain a first corrected signal;
a second subtracter for subtracting the modified first interfered signal from the second interfered signal to obtain a second corrected signal; and
a setter directly connected to the first modifier for determining the first transmission characteristic of the crosstalk by, when a first signal from a first signal source is sent across the first line and no signal is sent across the second line from a second signal source, forming a quotient from the second interfered signal and the first interfered signal, the setter also directly connected to the second modifier for determining a second transmission characteristic of the crosstalk by, when a second signal is sent from the second signal source and no signal is sent from the first signal source, forming a quotient from the first interfered signal and the second interfered signal.

15. A device for reducing mutual crosstalk of a first signal routed across a first line and a second signal routed across a second line, wherein by the mutual crosstalk at an output of the first line a first interfered signal may be obtained and at an output of the second line a second interfered signal may be obtained, the device comprising:
a first signal input for the first interfered signal that is interfered by crosstalk due to the second signal;
a second signal input for the second interfered signal that is interfered by crosstalk due to the first signal;
a first signal modifier comprising an input coupled to the first signal input and comprising an output for a first modified interfered signal, wherein the first signal modifier applies a first transmission characteristic to the first interfered signal to produce the first modified interfered signal;
a second signal modifier comprising an input coupled to the second signal input and comprising an output for a second modified interfered signal, wherein the second signal modifier applies a second transmission characteristic to the second interfered signal to produce the second modified interfered signal;
a first signal combiner coupled to the first signal input and the output of the second signal modifier and comprising an output for a first corrected signal;
a second signal combiner coupled to the second signal input and the output of the first signal modifier and comprising an output for a second corrected signal; and
a setter directly connected to the first signal modifier for determining the first transmission characteristic of the crosstalk by, when a first signal from a first signal source is sent across the first line and no signal is sent across the second line from a second signal source, forming a quotient from the second interfered signal and the first interfered signal, the setter also directly connected to the second signal modifier for determining a second transmission characteristic of the crosstalk by, when a second signal is sent from the second signal source and no signal is sent from the first signal source, forming a quotient from the first interfered signal and the second interfered signal.

16. The device according to claim 15, wherein the first routed signal is sent from a first signal source and the second routed signal is sent from a second signal source, wherein the first signal source comprises a first capacitance and the second signal source comprises a second capacitance, and wherein the signal lines are placed with regard to each other so that a mutual crosstalk takes place above a noise threshold, and wherein the first and the second signal modifier are each adapted to attenuate the first interfered signal and the second interfered signal with one attenuator each, wherein for frequencies greater than zero a frequency characteristic of the attenuators comprises a flat course in a predetermined range.

17. The device according to claim 16, wherein the first and the second signal source each are memory cells of a DRAM memory.

18. The device according to claim 16, wherein the frequency characteristics of the attenuators each maximally fluctuate by ±20% around an attenuation mean value in the predetermined range.

19. The device according to claim 15, wherein the first signal modifier comprises a filter that is adapted to model a frequency-dependent crosstalk from the first routed signal to the second routed signal, and wherein the second signal modifier comprises a filter that is adapted to model frequency-dependent crosstalk from the second routed signal to the first routed signal.

20. The device according to claim 19, wherein a filter characteristic of the filters is variable to be able to model changes of the frequency-dependent crosstalk from the first routed signal to the second routed signal and vice versa.

21. The device according to claim 15, wherein an information bit may be represented by a potential difference between a positive line and a negative line, wherein a first positive and a first negative line are laid for a first information bit, a second positive and a second negative line are laid for a second information bit, a third positive and a third negative line are laid for a third information bit, and wherein the first signal modifier is adapted to be coupled to the first negative line for the first information bit and the second positive line for the second information bit, and wherein the second signal modifier is adapted to be coupled to the second negative line for the second information bit and to the third positive line for the third information bit, wherein the device further comprises an information receiver that is adapted to form a difference from a corrected second positive signal and a corrected second negative signal to receive the second information bit.

22. The device according to claim 21, wherein the first signal modifier is adapted to modify the interfered signal of the first negative line that is interfered by crosstalk due to a signal of the second positive line, and wherein the second signal modifier is adapted to modify an interfered signal of the third positive line that is interfered by crosstalk due to a signal of the second negative line.

23. A device for reducing mutual crosstalk of a first signal routed across a first line and a second signal routed across a second line, wherein by the mutual crosstalk at an output of the first line a first interfered signal may be obtained and at an output of the second line a second interfered signal may be obtained, the device comprising:
  means for modifying the first interfered signal that is interfered by crosstalk due to the second signal and for modifying the second interfered signal that is interfered by crosstalk due to the first signal, wherein the means for modifying is adapted to model an interference due to the mutual crosstalk;
  means for combining the first interfered signal with the modified second interfered signal to obtain a first corrected signal and for combining the second interfered signal with the modified first interfered signal to obtain a second corrected signal; and
  means directly connected to the means for modifying for determining a first transmission characteristic of the crosstalk by, when a first signal from a first signal source is sent across the first line and no signal is sent across the second line from a second signal source, forming a quotient from the second interfered signal and the first interfered signal and for determining a second transmission characteristic of the crosstalk by, when a second signal is sent from the second signal source and no signal is sent from the first signal source, forming a quotient from the first interfered signal and the second interfered signal.

* * * * *